United States Patent
Henry et al.

(10) Patent No.: US 10,854,801 B1
(45) Date of Patent: Dec. 1, 2020

(54) BONDING STRATEGIES FOR PLACEMENT OF LEDS FROM MULTIPLE CARRIER SUBSTRATES

(71) Applicant: Facebook Technologies, LLC, Menlo Park, CA (US)

(72) Inventors: William Padraic Henry, Cork (IE); John Michael Goward, Ayr (GB)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/943,564

(22) Filed: Apr. 2, 2018

(51) Int. Cl.
| | |
|---|---|
| H01L 33/62 | (2010.01) |
| H01L 23/00 | (2006.01) |
| H01L 33/00 | (2010.01) |
| H01L 27/15 | (2006.01) |
| H01L 25/075 | (2006.01) |

(52) U.S. Cl.
CPC .............. *H01L 33/62* (2013.01); *H01L 24/29* (2013.01); *H01L 24/32* (2013.01); *H01L 24/81* (2013.01); *H01L 24/83* (2013.01); *H01L 25/0753* (2013.01); *H01L 27/156* (2013.01); *H01L 33/005* (2013.01); *H01L 2224/81345* (2013.01); *H01L 2924/12041* (2013.01)

(58) Field of Classification Search
CPC .............................. H01L 21/683–68792; H01L 2221/68304–68395; H01L 33/00–648; H01L 25/0753
See application file for complete search history.

(56) References Cited

U.S. PATENT DOCUMENTS

| | | | | |
|---|---|---|---|---|
| 5,286,335 | A * | 2/1994 | Drabik | H01L 24/96 117/915 |
| 2017/0179097 | A1* | 6/2017 | Zhang | H01L 25/50 |
| 2017/0373046 | A1* | 12/2017 | Gardner | F02F 1/40 |
| 2018/0158806 | A1* | 6/2018 | Lai | H01L 25/0753 |
| 2018/0175262 | A1* | 6/2018 | Jansen | H01L 33/58 |

* cited by examiner

*Primary Examiner* — Eric A. Ward
(74) *Attorney, Agent, or Firm* — Fenwick & West LLP

(57) ABSTRACT

A method for directly bonding semiconductor devices from multiple carrier substrates to a target substrate using relative alignments of semiconductor contacts to substrate contacts, as well as relative heights of semiconductor contacts to substrate contacts. The method may include directly bonding a subset of semiconductor devices on a first carrier substrate with a first alignment to a subset of substrate contacts, and directly bonding a subset of second semiconductor device on a second carrier substrate with a second alignment to a subset of substrate contacts. The method may include directly bonding a subset of semiconductor devices with a first height on a first carrier substrate to a first subset of substrate contacts, followed by directly bonding a second subset of second semiconductor devices with a second height on a second carrier substrate to a second subset of substrate contacts.

10 Claims, 12 Drawing Sheets

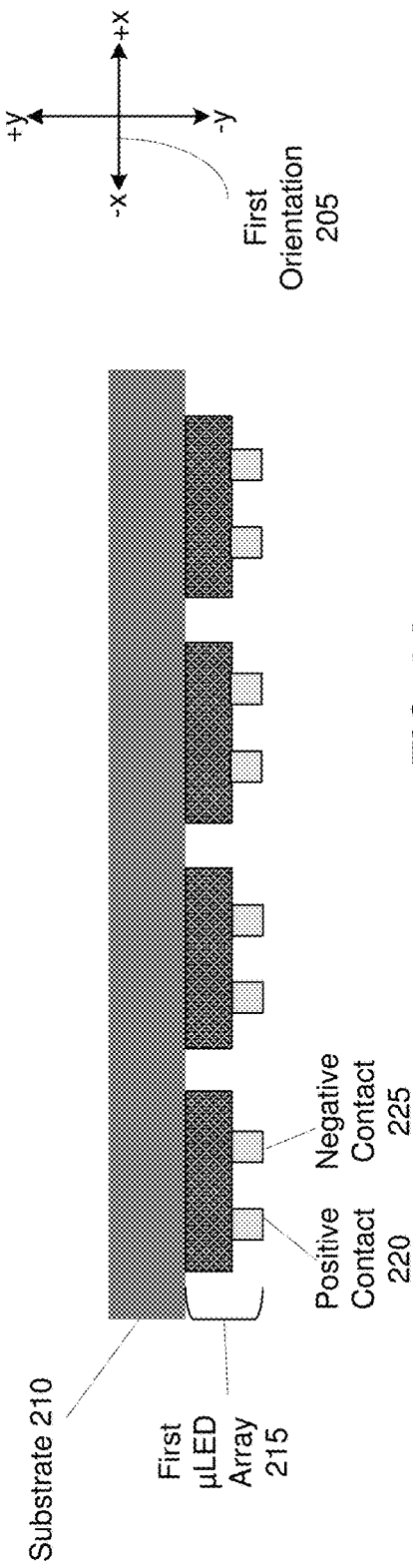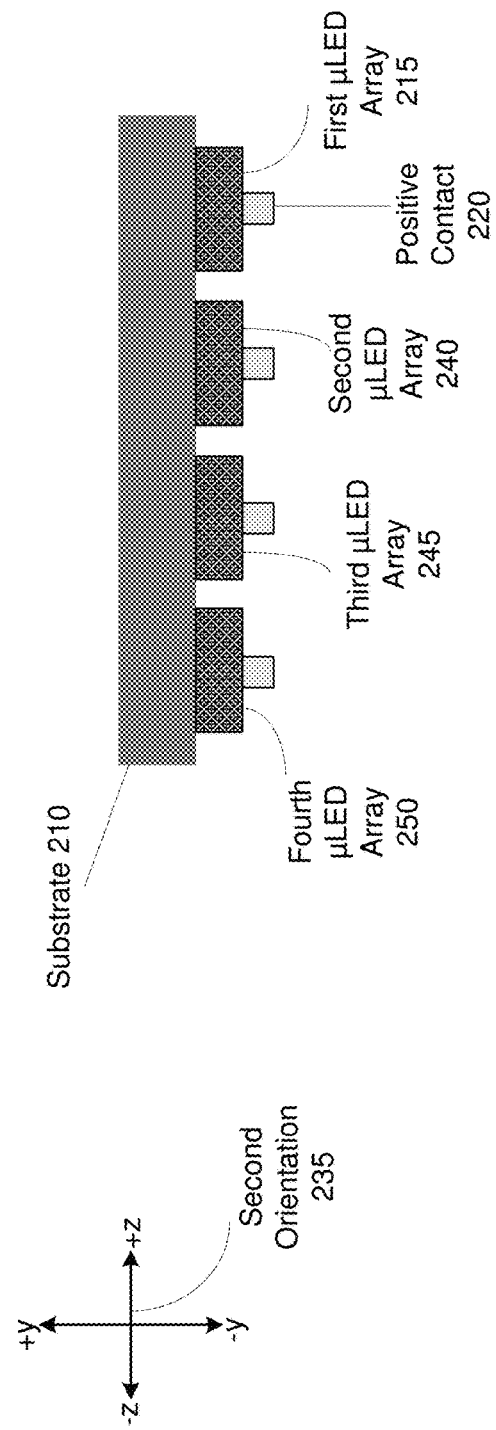

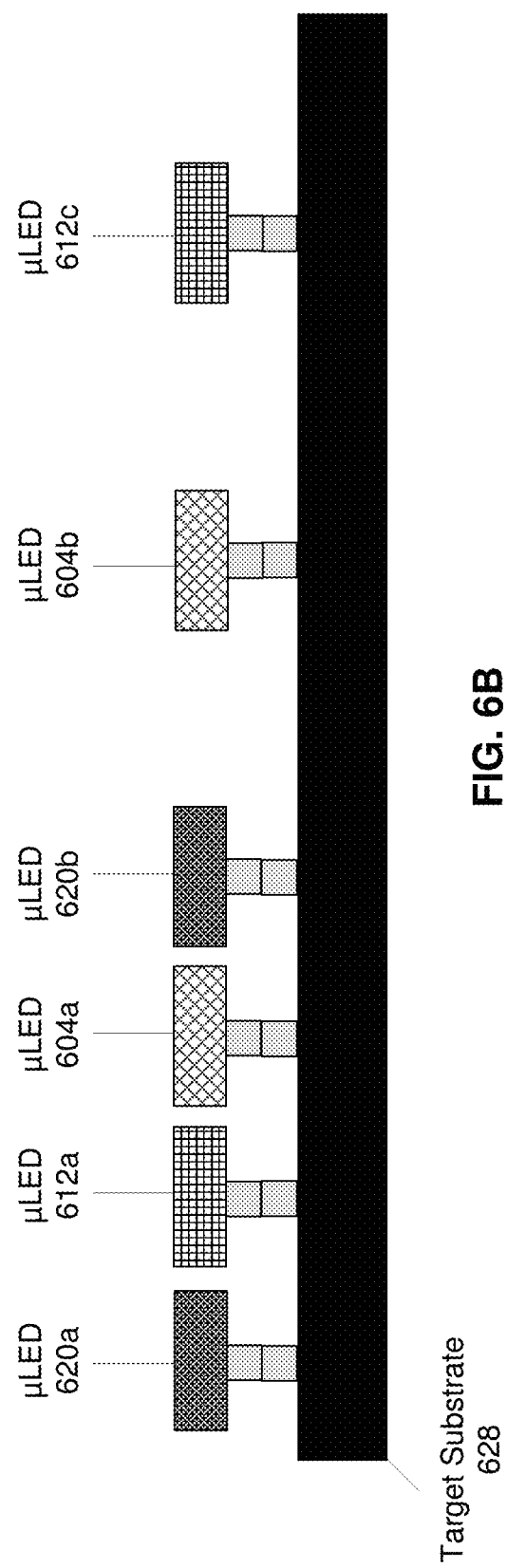

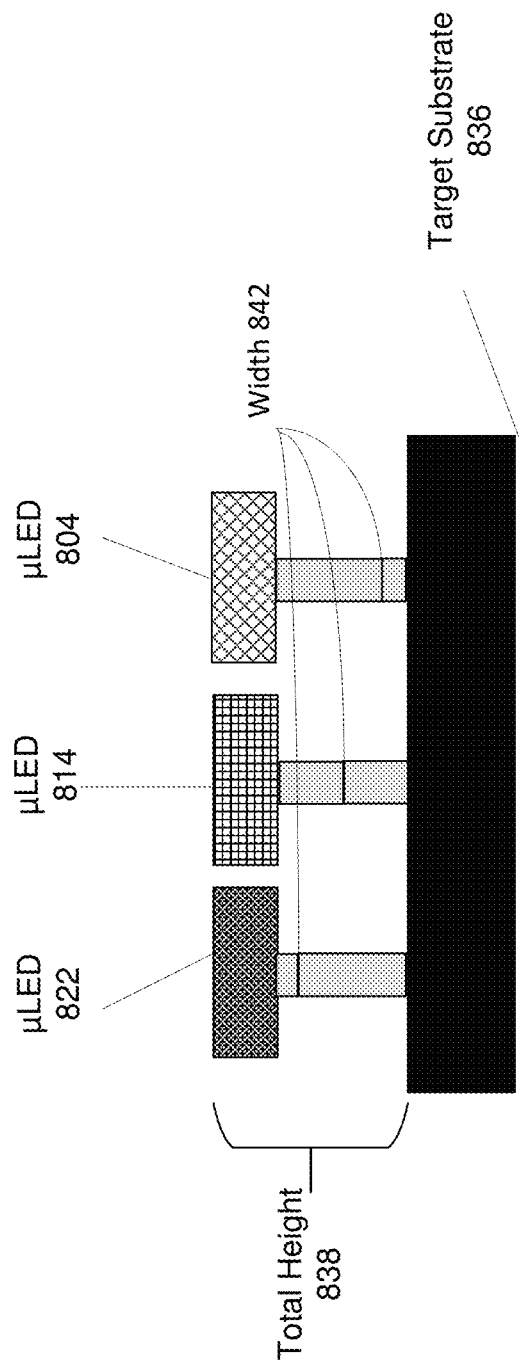

BONDING STRATEGIES FOR PLACEMENT OF LEDS FROM MULTIPLE CARRIER SUBSTRATES

BACKGROUND

Field of the Disclosure

The present disclosure relates to bonding strategies for placing semiconductor devices from a carrier substrate to a target substrate, and in particular for placing semiconductor devices originating from multiple carrier substrates onto a single target substrate.

Discussion of the Related Art

To populate a display with very small light emitting diodes (LEDs), such as micro-LEDs (μLED), the LEDs may be transferred from a native substrate on which they were manufactured to a target substrate that forms part of a display, or "display substrate." Such small semiconductor devices may be assembled with a defined separation distance between them or closely packed together on the target substrate. Because of the small size of these devices (e.g., smaller than 49×40 μm), conventional pick and place techniques and direct bonding techniques are unsuitable.

Many modifications have been proposed for improving pick and place of μLEDs, such as vacuum pick-up, electrostatic pick-up, transfer printing, etc. However, many of these improvements still have drawbacks, including slow rates, physical damage to the μLEDs during transfer, and the potential for electrostatic discharge of sensitive devices when using electrostatic pick-up.

Direct bonding of μLEDs onto a target substrate is an attractive alternative, however existing bonding techniques do not allow for the flexibility of μLED placement that is currently available using conventional pick and place methods. This is particularly true when μLEDs from multiple carriers are placed at different locations on the target substrate. Multiple carriers are used because of the different composition and structure of μLEDs that emit different wavelengths or "colors." For example, each color of μLED is grown on a different native substrate, which is then placed onto a target substrate to allow for μLED displays with different colored μLEDs. However, direct placement of the different colored μLEDs often results in the accidental bonding of μLEDs at undesired locations on the target substrate and a general lack of precision in placement of μLEDs.

SUMMARY

Embodiments relate to directly bonding semiconductor devices from multiple carrier substrates to a target substrate. A first carrier substrate mounted with a first array of LEDs is moved towards a target substrate. First contacts of the first array of LEDs are bonded directly onto a first subset of contact protrusions on the target substrate responsive to moving the first carrier substrate. The first subset of contact protrusions are matched with the first array of LEDs. A second substrate mounted with a second array of LEDs is moved towards the target substrate responsive to bonding the first contacts onto the first subset of contact protrusions. The second contacts of the second array of LEDs are bonded directly onto a second subset of contact protrusions on the target substrate responsive to moving the second substrate. The second subset of contact protrusions is matched with the second array of LEDs but mismatched with the first array of LEDs.

BRIEF DESCRIPTION OF THE DRAWINGS

Figure (FIG. 1 is schematic diagram illustrating a display assembly system, according to one embodiment.

FIG. 2A is a cross-sectional diagram illustrating a substrate with first μLED array taken across a z-plane, according to one embodiment.

FIG. 2B is a cross-sectional diagram illustrating the substrate of FIG. 2A taken across an x-plane, according to one embodiment.

FIG. 6B illustrates the resulting μLED configuration from the direct bonding shown in FIG. 6A, according to one embodiment.

FIG. 8B illustrates the resulting μLED configuration from direct bonding shown in FIG. 8A, according to one embodiment.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments are described herein with reference to the figures where like reference numbers indicate identical or functionally similar elements. Also in the figures, the left most digit of each reference number corresponds to the figure in which the reference number is first used.

Embodiments relate to direct bonding semiconductor devices from a carrier substrate to a target substrate using offsets and height differences between semiconductor contacts and the contacts on a target substrate. This is particularly useful for placing semiconductor devices originating from multiple carrier substrates onto a single target substrate. In some embodiments, different offsets are used between semiconductor contacts originating from different carrier substrates, allowing for selective direct bonding of semiconductors from carrier substrates to the target substrate. In some embodiments, different contact heights of semiconductor contacts and target substrate contacts allow for selective direct bonding of semiconductors from carrier substrates to the target substrate.

Figure 1:
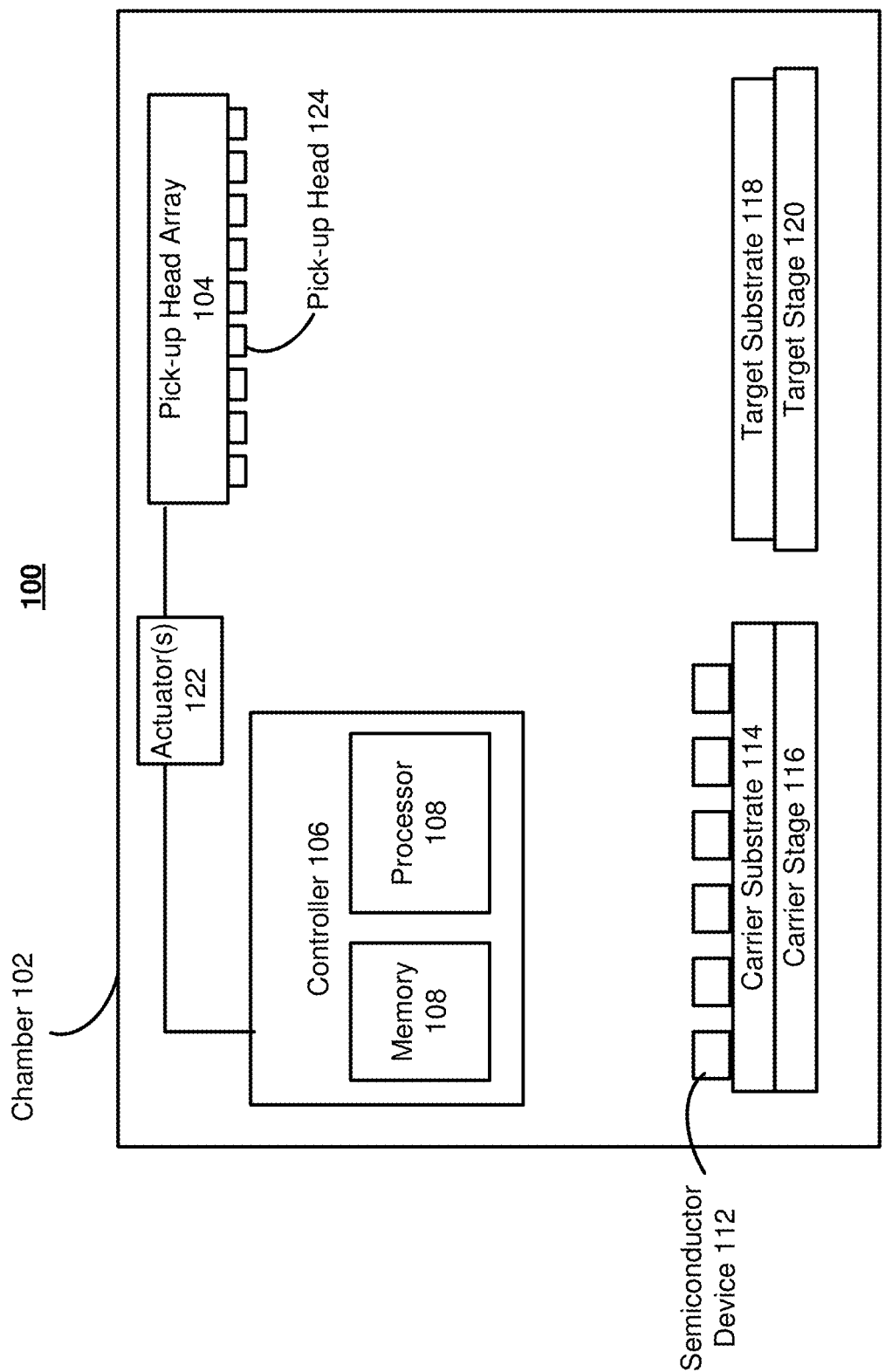

FIG. 1 is schematic diagram illustrating a display assembly system 100, according to one embodiment. The system 100 fabricates a display device through a pick and place technique. Specifically, the system 100 assembles semiconductor devices 112 by picking up micro-LEDs (μLEDs) from a carrier substrate 114 and places them onto a target substrate 118. In some embodiments, the semiconductor devices 112 are light emitting diode (LED) dies that emit different color. In some embodiments, the semiconductor devices 112 are different color μLEDs having a reduced divergence of light output and a small light emitting area. The carrier substrate 114 may be a carrier film that holds the semiconductor devices 112 for pick up by the pick-up head array 104. In other embodiments, the carrier substrate 114 is the native substrate on which the semiconductor device 112 is grown.

The target substrate 118 may be a display substrate, or may be an intermediate carrier substrate that facilitates bonding with a display substrate. The system 100 places μLEDs at pixel locations of the display substrate, and then bonds the μLEDs to the display substrate.

As shown, the system 100 further includes a pick-up head array 104, an actuator 122, a carrier stage 116, and a target stage 120. The carrier stage 116 holds a carrier substrate 114 having semiconductor devices 112. The target stage 120 holds a target substrate 118 to receive some or all of the semiconductor devices 112 from the carrier substrate 114.

A controller 106 is coupled to the pick-up head array 104 (e.g., via the actuator 122) and controls the operations of the pick-up head array 104. For example, the controller 106 causes the pick-up head array 104 to pick up one or more semiconductor devices 112 located on a carrier substrate 114, and place the one or more semiconductor devices on the target substrate 118. The controller 106 may include, among other components, memory 108 and a processor 109. The memory 108 stores instructions for operating the pick-up head array. The processor 109 executes the instructions stored in the memory 108 and sends out the instructions to the pick-up head array 104 via a signal interface (not shown).

The pick-up head array 104 includes a plurality of pick-up heads 124. Each pick-up head 124 can pick up a semiconductor device 112 from the carrier substrate 114, and place the semiconductor device on the target substrate 118. After picking up a semiconductor device 112, the pick-up head 124 is aligned with a location on the target substrate 118.

The actuator 122 is an electro-mechanical component that controls the movement of the pick-up head array 104 based on instructions from the controller 106, and thus controls the transfer of the semiconductor device 112 from carrier substrate 114 and placement on the target substrate 118. For example, the actuator 122 may move the pick-up head array 104, or individual pick-up heads 124, with three degrees of freedom including up and down, left and right, and forward and back. The actuator 122 may be embodied, for example, as a rotating motor, a linear motor or a hydraulic cylinder.

The controller 106 aligns the one or more pick-up heads 124 with the display substrate 118, and places the semiconductor devices 112 attached to the one or more pick-up heads 124 on the display substrate 118.

The system 100 may include one or more carrier substrates 114. For example, different carrier substrates 114 may carry different color LED dies. A carrier substrate 114 may be carrier film that holds singulated semiconductor devices 112 for transfer to the display substrate 118. The system may include one or more target substrates 118. In some embodiments, such as when the target substrate 118 is the display substrate for receiving the semiconductor devices 112, the target stage 120 includes a heater for thermal conductive bonding of the electrical contact pads of the semiconductor devices 112 to the display substrate 118 subsequent to placement of the semiconductor devices 112 on the display substrate 118 by the pick-up head 104.

In some embodiments, the system 100 includes multiple pick-up head arrays 104 each positioned at a separate station. Each station may be dedicated to the pick and place of a particular color LED, such as a green station for green LEDs, a red station for red LEDs, and a blue station for blue LEDs, etc. Different colored LEDs are grown on different native substrates, which may be different carrier substrates 114 as shown in FIG. 1, due to differences in their composition and structure.

The system 100 provides a way to place different colored LEDs from different carrier substrates 114 onto a single target substrate 118. The pick-up head array 104 allows for placement of the semiconductor device 112 onto the target substrate 118 from multiple different carrier substrates 114, whether through multiple pick-up head arrays 104 at multiple stations, or by conveying new carrier substrates 114 to a single station as shown in system 100. The three degrees of freedom of the pick-up head 124 and pick-up head array 104 provide flexible placement of the semiconductor device 112 onto any desired position on the target substrate 118. Thus system 100 arranges different colored LEDs onto the target substrate 118 in any desired configuration.

However, as discussed above, when the semiconductor device 112 is a μLED, the system 100 may be insufficiently accurate, and produce low yield in part due to frequent damage to the μLEDs (i.e. semiconductor device 112) during transfer from the carrier substrate 114 to the target substrate 118. μLEDs are typically anywhere from 1-10 μm in diameter. This small surface area with which the pick-up head 124 can make contact means that the accuracy of the pick-up head 124 may limit the system 100's ability to precisely transfer μLEDs to the target substrate. Current accuracy levels of system 100 often fail to meet this requirement, leading to frequent misplacement of μLEDs onto the target substrate 118. Furthermore, when the pick-up head 124 contacts the μLED semiconductor device 112 in order to place it on the target substrate 118, the contact with the μLED often results in damage to the μLED. The speed at which the system 100 is able to transfer μLEDs onto the target substrate 118 is another limitation of system 100, as only a small number of μLEDs can be transferred at once to the target substrate, making the mass production of displays with μLEDs using a pick-and-place system difficult.

The present disclosure provides an alternative or an additional way to the pick and place μLEDs onto the target substrate 118, allowing for an increase in accuracy, a decrease in μLED damage, and faster transfer of μLEDs while still allowing for the placement flexibility of system 100. By directly bonding μLEDs from a carrier substrate 114 to a target substrate 118, the pick-and-place technique of system 100 can be replaced or supplanted.

FIG. 2A is a cross-sectional diagram illustrating a substrate 210 with first μLED array 215 taken across a z-plane, according to one embodiment. FIG. 2A shows the first μLED array 215 on substrate 210. Substrate 210 may be the native substrate of the first μLED array 215. The first μLED array 215 contains μLEDs that emit the same color light. The color of emitted light of a μLED (e.g. the wavelength range) is referred to throughout as the "color" of the μLED. Each μLED includes a positive contact 220 and a negative contact 225. Positive contact 220 and negative contact 225 may be formed from the same material or different materials, which may be any conductive material capable of bonding to a target substrate, such as the target substrate 118 as shown in FIG. 1. The positive contact 220 and the negative contact 225 are bonded to contacts on a target substrate, as described in further detail with reference to FIGS. 3A through 8. The first μLED array 215 has a single wafer layer, however the μLEDs may each have any number of sub-layers (not shown).

FIG. 2B is a cross-sectional diagram illustrating the substrate 210 of FIG. 2A, taken across an x-plane. First μLED array 215 is the same array as shown in FIG. 2A, however shown in an orientation where only the positive contact 220 is visible. Behind the first μLED array 215 in the x axis are second μLED array 240, third μLED array 245, and fourth μLED array 250 as shown in FIG. 2A. There may be any number of arrays of μLEDs located on the substrate 210. As shown in FIG. 2A, each of the first μLED array 215, second μLED array 240, third μLED array 245, and fourth μLED array 250 contain a plurality of μLEDs extending along the x axis.

FIG. 3A through 8 show μLEDs where only the positive contact 220 or negative contact 225 are visible. However, it should be understood that FIG. 3A through 8 are side views of μLED arrays, and that the bonding techniques described herein apply to both the positive contact 220 and the negative contact 225 of the μLEDs shown herein. As described herein, contacts, such μLED contacts or substrate contacts, refer to either the positive contact 220 or negative contact 225 of the μLEDs as shown in FIGS. 2A and 2B. As described herein, μLEDs mounted to the same carrier substrate have the same composition and structure, and thus emit the same "color."

Figure 3A:
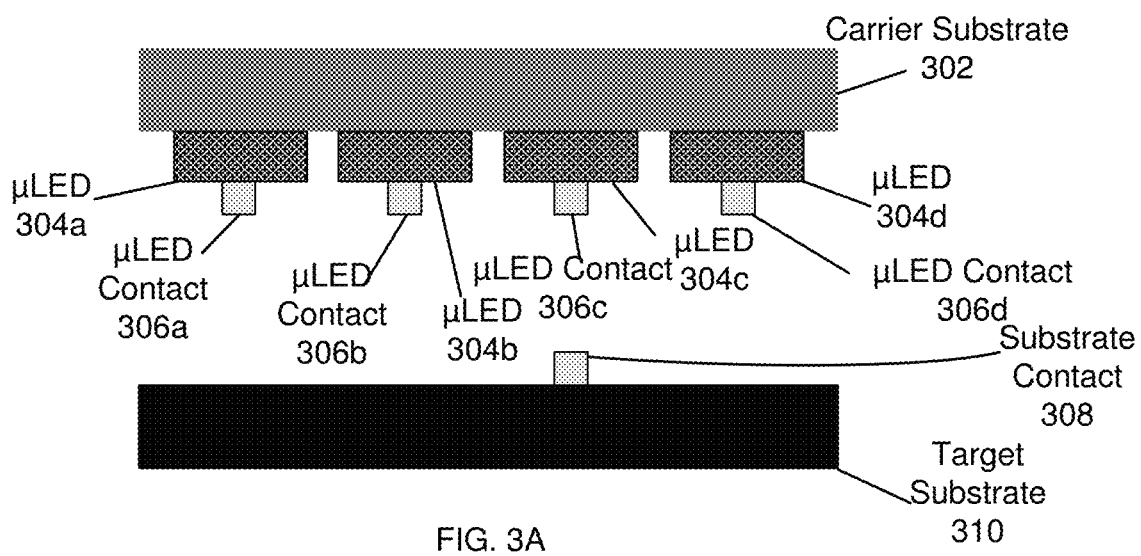
FIGS. 3A through 3C are diagrams illustrating direct bonding of a μLED from a carrier substrate to a target substrate, according to one embodiment.
Figure 3B:
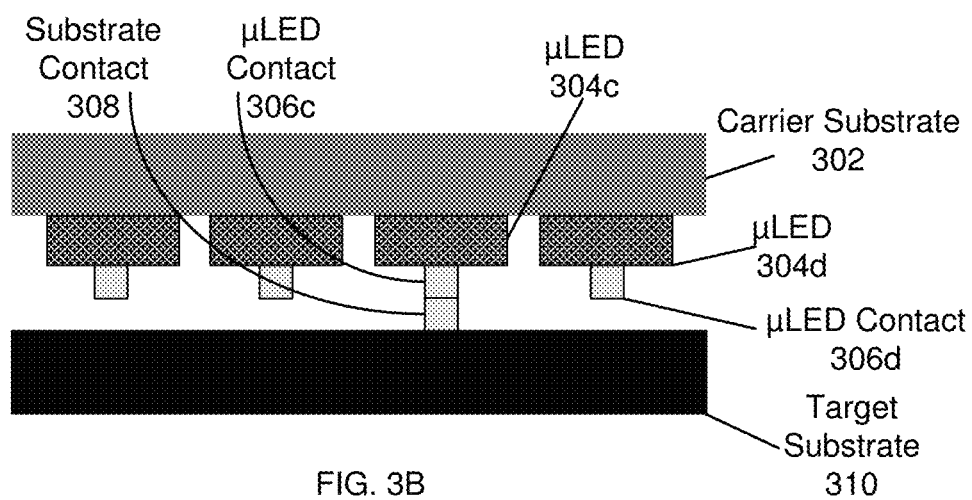
Figure 3C:
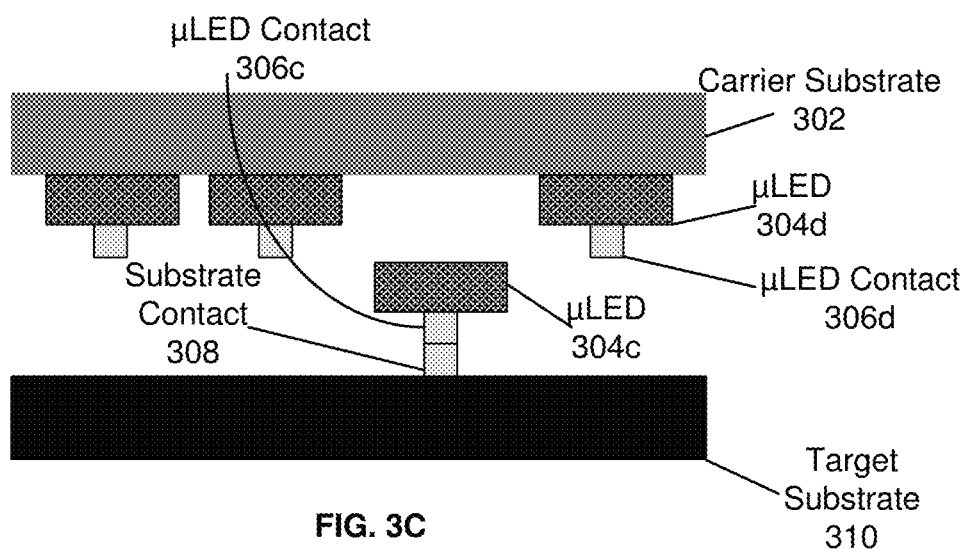

FIGS. 3A through 3C are diagrams illustrating direct bonding of a μLED from a carrier substrate to a target substrate, according to one embodiment. FIG. 3A is a diagram illustrating direct bonding a plurality of μLEDs from a carrier substrate 302 to a target substrate 310. As shown at FIG. 3A, a carrier substrate 302 contains a plurality of μLEDs: μLED 304a, μLED 304b, μLED 304c and μLED 304d, including contacts μLED contact 306a, μLED contact 306b, μLED contact 306c and μLED contact 306d, respectively. Contacts μLED contact 306a, μLED contact 306b, μLED contact 306c and μLED contact 306d may be positive contact 220 or negative contact 225 as shown in the first orientation 205 of substrate 210 in FIG. 2A.

The carrier substrate 302 may be a native substrate of the μLEDs shown in FIG. 3A. μLED 304a, μLED 304b, μLED 304c and μLED 304d emit the same colored light, and may have the same composition and structure. Carrier substrate 302 may be the native substrate of μLED 304a, μLED 304b, μLED 304c and μLED 304d. In other examples, carrier substrate 302 is an intermediate substrate, and μLED 304a, μLED 304b, μLED 304c and μLED 304d are grown together on a separate native substrate (not shown). Each of the μLEDs (μLEDs 304a, μLED 304b, μLED 304c and μLED 304d) may be a single μLED in an array of μLEDs bound to the carrier substrate 302 and extending in a direction orthogonal to the orientation of the carrier substrate 302 as shown in diagram 300.

The target substrate 310 includes a substrate contact 308. Substrate contact 308 may be formed from any conductive material. For example, substrate contact 308 may be copper or a copper alloy. The substrate contacts may be pixel locations, and the target substrate 310 may be a display substrate. The relative position of the substrate contact 308 to any of the μLED contacts of the μLEDs shown at FIG. 3A determines the bonding location of the μLED onto the target substrate 310. In FIG. 3A, the carrier substrate 302 is maneuvered by a controller (not shown) or any other alignment tool such that the μLED contact 306c is directly over the substrate contact 308. Thus as shown in FIG. 3A, the carrier substrate 302 is aligned with the target substrate 310 to bond the μLED 304c to the target substrate 310. This is described in further detail with reference to FIGS. 3B and 3C.

FIG. 3B illustrates direct bonding a μLED 304a from a carrier substrate 302 to a target substrate 310. The carrier substrate 302 is brought towards the target substrate 310 such that μLED contact 306c comes in contact with the substrate contact 308. Following the contact between μLED contact 306c and substrate contact 308, μLED contact 306c is bonded to the substrate contact 308. Bonding between the μLED contact 306c and the substrate contact 308 may occur as a result of compression and applied pressure, as the carrier substrate 302 is pressed towards the target substrate 310. Additionally or alternatively, bonding between the μLED contact 306c and the substrate contact 308 may occur as the result of heating of the carrier substrate 302 and/or the target substrate 310. Additionally or alternatively, bonding between the μLED contact 306c and the substrate contact 308 may occur from any standard curing technique, such as light curing, partial curing, etc.

The alignment of the carrier substrate 302 to the target substrate 310, and the resulting alignment of the μLED contacts with the substrate contacts, ensures that μLED 304c is the only μLED on the carrier substrate 302 that is bonded to the target substrate 310. As described herein, alignment may be referred to as matching, whereas misalignment may be referred to as mismatching. As shown in FIG. 3B, the μLED 304d is not bonded to the target substrate 310, because the μLED contact 306d does not come in contact with a substrate contact 308 on the target substrate 310. However, given a different alignment of the carrier substrate 302 to the substrate contact 308, any of the other μLEDs on the carrier substrate 302 could be bonded to the target substrate 310. For example, if carrier substrate 302 is aligned one spacing to the left, μLED 304d could be bonded to the target substrate 310 by contacting the μLED contact 306d to the substrate contact 308. In this example, μLED 304c would not be bonded to the target substrate 310. Thus the alignment selects the μLED from the array of μLEDs on a carrier substrate, but any μLED may be chosen. The final result of the bonding as shown in FIG. 3B is described with reference to FIG. 3C.

Following the contact between the μLED contact 306d to the substrate contact 308, the target substrate 310 may be heated and pressed such that the μLED contact 306d is bonded to the substrate contact 308.

FIG. 3C illustrates the result of direct bonding a μLED 304c from a carrier substrate 302 to a target substrate 310. After the μLED contact 306c is bonded to the substrate contact 308, the carrier substrate 302 is lifted away from the target substrate 310. The bonded interface between the μLED contact 306c and substrate contact 308 is stronger than the interface between the μLED 304c and the carrier substrate 302, such that the movement of the carrier substrate 302 away from the target substrate 310 removes the μLED from the carrier substrate 302, as shown in FIG. 3C. The movement of the carrier substrate 302 away from the target substrate 310 leaves μLED 304c on the target substrate 310.

The result of the direct bonding as shown in FIG. 3A through 3C is thus that a single μLED 304c is bonded to the target substrate 310, while the remainder of the μLEDs on the carrier substrate 302 can be subsequently used and placed elsewhere on the target substrate 310 or another target substrate (not shown). Direct bonding, as shown in FIG. 3A through 3C is thus an alternative to a pick and place technique for placing μLED 304c on the target substrate 310. Direct bonding as described in FIG. 3A through 3C, is used to bond μLED contacts to target substrate contacts in the processes described in FIG. 4 through 10.

Figure 4:
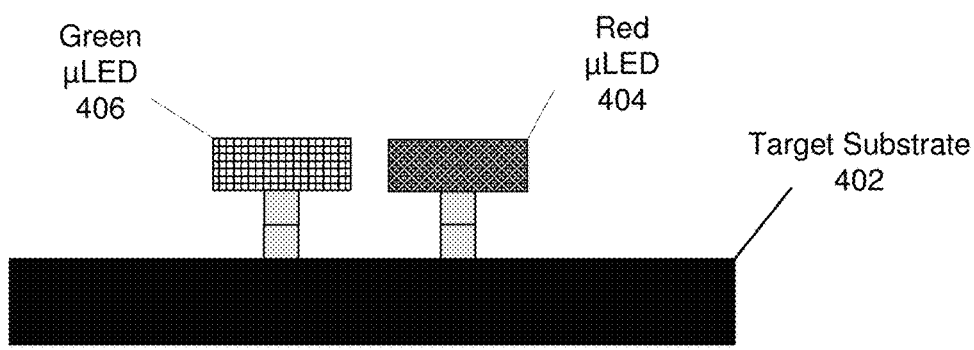
FIG. 4 illustrates an intended μLED configuration on a target substrate, according to one embodiment.

FIG. 4 illustrates a target μLED configuration on a target substrate 402, according to one embodiment. As shown in FIG. 4, the target substrate 402 has a green μLED 406 placed next to a red μLED 404. It is to be noted that the configuration of FIG. 4 is merely illustrative; μLED 406 may be any color μLED, while μLED 404 may be any color μLED of a different color from μLED 406. Additionally or alternatively, μLED 406 originates from a first carrier substrate, while μLED 404 originates from a second carrier substrate different from the first. Additionally or alternatively, μLED 406 has a different wafer substructure from μLED 404, such that μLED 406 is grown using a different process from μLED 404 and on a different native substrate.

FIG. 4 shows the target configuration of μLEDs on the target substrate 402. Using the direct bonding process, as shown and described above with reference to FIGS. 3A through 3C, achieving the target configuration of μLEDs on the target substrate 402 presents a number of challenges. These are described in further detail below with reference to FIG. 5A through 5B. However, the direct bonding process as described herein and in further detail with reference to FIGS. 6A through 10 makes achieving the target configuration of μLEDs on the target substrate 402 as shown in FIG. 4 possible, using a modification of the direct bonding process as shown in FIGS. 3A through 3C.

Figure 5A:
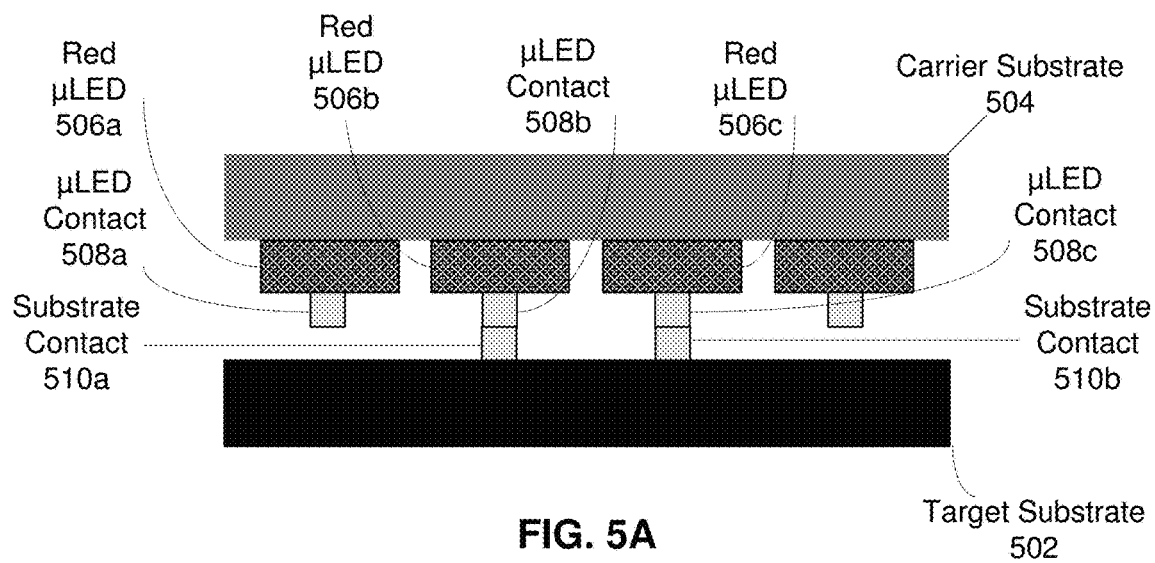
FIGS. 5A and 5B are diagrams illustrating a difficulty of achieving the target configuration of FIG. 4 of μLEDs on a target substrate
Figure 5B:
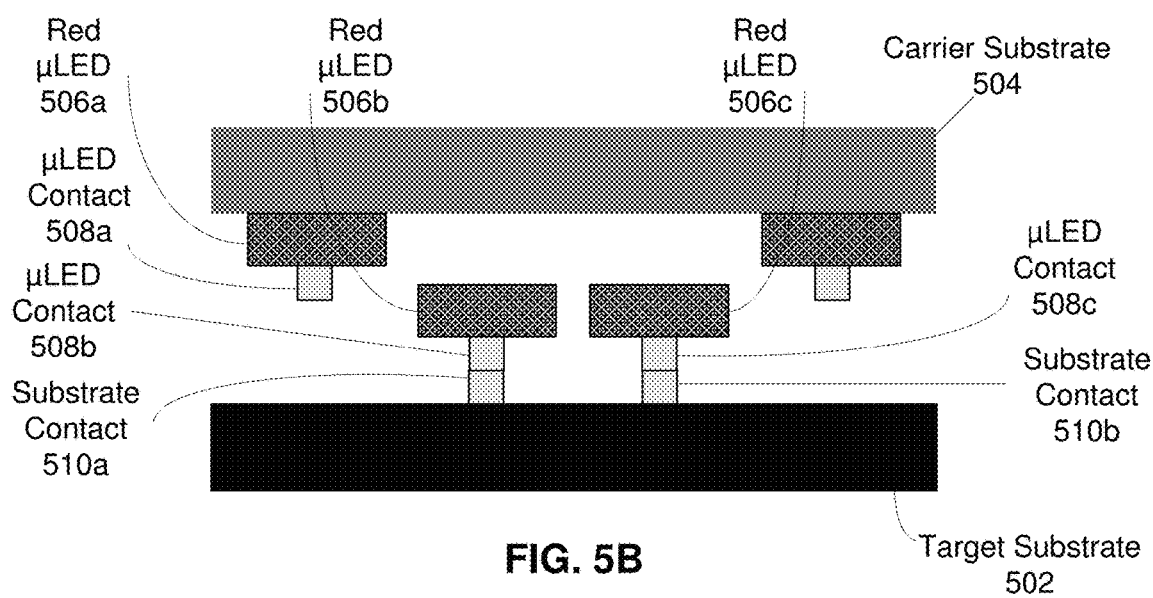

FIGS. 5A and 5B illustrate a difficulty of achieving the target configuration of FIG. 4 of μLEDs on a target substrate 502. A carrier substrate 504 containing multiple arrays of μLEDs, shown as red μLED 506a, red μLED 506b and red μLED 506c, is brought towards the target substrate 502. Each μLED in the array of μLEDs on the carrier substrate 504 includes a μLED contact, which may be either a positive or a negative contact as shown and described in further detail above with reference to FIGS. 2A and 2B. μLED contact 508a is the contact for red μLED 506a, μLED contact 508b is the contact for red μLED 506b, and μLED contact 508c is the contact for red μLED 506c.

In order to achieve the target μLED configuration as shown in FIG. 4, a single red μLED should be bonded to the target substrate 502. The target substrate contains two substrate contacts (substrate contact 510a and substrate contact 510b) to bond a single green μLED 406 and a single red μLED 404 to the target substrate 502, as shown in FIG. 4. However, as shown in FIG. 5A, when the carrier substrate 504 is aligned with the target substrate 502 to bind the red μLED 506c to the substrate contact 510b, a second μLED (red μLED 506b) also comes into contact with the adjacent substrate contact 510a. If heat and/or compression is applied between the μLED contact 508c and the substrate contact 510b to bond red μLED to the target substrate 502, this also results in the formation of a bond between μLED contact 508b and substrate contact 510a. Thus, in the process of direct bonding red μLED 506c to the target substrate 502, the adjacent red μLED 506b is also directly bonded.

FIG. 5B illustrates the resulting μLED configuration using bonding of μLEDs as shown in FIG. 5A. FIG. 5B shows the result of multiple μLEDs from the carrier substrate 504 making contact with the substrate contacts of target substrate 502. When the carrier substrate 504 is moved away from the target substrate 502, both of the substrate contacts (510a and 510b) are occupied by μLEDs from the carrier substrate 504. Thus, red μLED 506b is bonded to the target substrate 502 via the bonded interface between μLED contact 508b and substrate contact 510a, as well as the intended red μLED 506c via the bonded interface between μLED contact 508c and substrate contact 510b. If a second carrier substrate containing green μLED 406 was brought into contact with the target substrate 502 following bonding of red μLED 506c, it would thus be unable to bond the green μLED 406 to the target substrate 402, and may result in damage to the green μLED 406.

Thus, achieving the target μLED configuration as shown in FIG. 4 is difficult, since in attempting to bond a single μLED from the carrier substrate 504 to the substrate contact 510b, the adjacent μLED red μLED 506b is also inadvertently bonded to the substrate contact 510a. Thus, achieving the target configuration of μLEDs as shown in FIG. 4 may not be possible with the conventional direct bonding techniques as shown in FIGS. 5A and 5B.

As described in FIGS. 4-5B, the target configuration as shown in FIG. 4 may be a specific placement of different colored μLED originating from different carrier substrates. However, the direct bonding techniques described herein may apply to any process in which μLEDs from different carrier substrates are selectively bonded to a target substrate, and thus the target configuration may be any specific placement of μLEDs and is not limited to arrangements of different colored μLEDs. For example, a carrier substrate of tested and functioning μLEDs may be selectively bonded to a target substrate in place of damaged μLEDs on a separate carrier substrate. For example, the green μLED 406 in the target configuration may instead be a functioning red μLED, and the red μLED 404 is a second functioning μLED. However, on the carrier substrate 504, red μLED 506b may be known to be a damaged μLED, while red μLED 506c is a tested and functioning μLED. Thus, to achieve the target configuration of FIG. 4 with two functioning red μLEDs, red μLED 506c should be bonded to the substrate contact 510b, but red μLED 506b should not be bonded to the substrate contact 510a. In attempting to direct bond μLEDs to achieve this target configuration, the same problem results as described in FIG. 5A-5B, in which conventional direct bonding techniques would not allow for selective bonding of functioning μLEDs from different carrier substrates to a single target substrate. However, any of the direct bonding techniques described below may be used to selectively bond functioning μLEDs and avoid bonding damaged μLEDs to a target substrate. This may thus improve the yield of the target substrates, allow for greater flexibility, and avoid the bonding difficulties described in FIGS. 5A-5B.

Figure 6A:
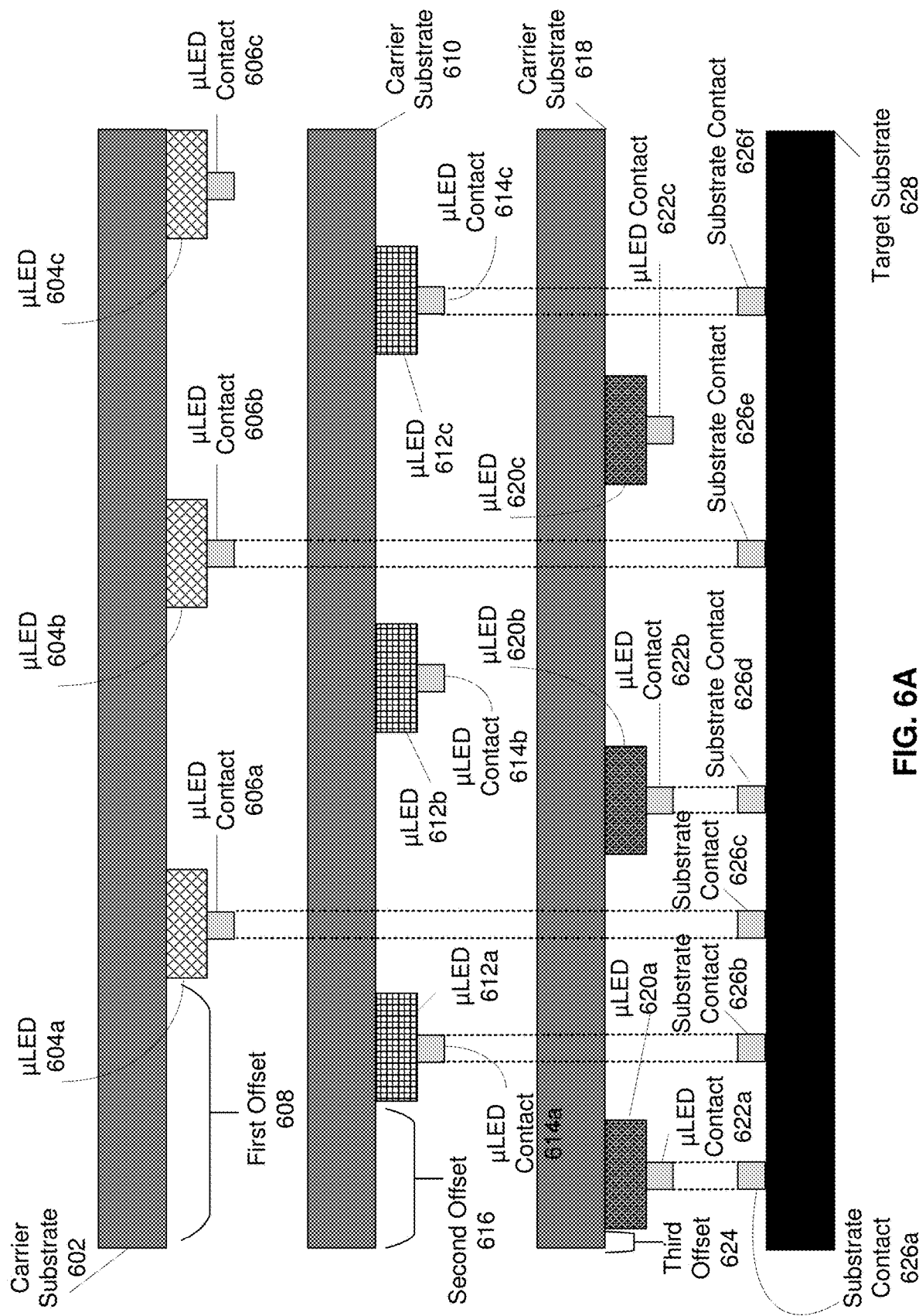
FIG. 6A illustrates direct bonding of μLEDs using different offsetting of μLEDs, according to one embodiment.

FIG. 6A illustrates direct bonding of μLEDs using different offsetting of μLEDs. The carrier substrate 602 includes μLED 604a, μLED 604b, and μLED 604c, which have μLED contact 606a, μLED contact 606b, and μLED contact 606c, respectively. The μLEDs on carrier substrate 602 are aligned so that the leftmost μLED is offset from a left edge of the carrier substrate with a first offset 608. The carrier substrate 610 includes μLED 612a, μLED 612b, and μLED 612c, which have µLED contacts µLED contact 614a, µLED contact 614b, and µLED contact 614c, respectively. The µLEDs on carrier substrate 602 are aligned so that the leftmost µLED is offset from a left edge of the carrier substrate with a second offset 616 that is different from the first offset 608. The distances between the µLEDs on the carrier substrate 602 are assumed to be identical to the distances between the µLED on the carrier substrate 610. The carrier substrate 618 includes µLED 620a, µLED 620b, and µLED 620c, which have µLED contacts µLED contact 622a, µLED contact 622b, and µLED contact 622c, respectively. The µLEDs on carrier substrate 618 are aligned so that the leftmost µLED is offset from the left edge of the carrier substrate 618 by a third offset 624 that is different from the first offset 608 and the second offset 616. The distances between the µLEDs on the carrier substrate 618 are assumed to be identical to the distances between the µLED on the carrier substrates 602, 610. The alignments of the µLEDs allow direct bonding of µLEDs to the target substrate 628 without leading to inadvertent bonding of µLEDs as described above with reference to FIGS. 4 through 5B.

The µLEDs on carrier substrate 602 may have a first color emitted light, while the µLEDs on carrier substrate 610 have a second color emitted light, and the µLEDs on carrier substrate 618 have a third color emitted light. For example, the µLEDs on carrier substrate 602 may be red, the µLEDs on carrier substrate 610 may be green, and the µLEDs on carrier substrate 618 may be blue. Each of the carrier substrates 602, 610 and 618 may be the native substrates of their respective µLEDs, such that each of the µLEDs are grown separately on each carrier substrate. Alternatively, the carrier substrates may be intermediate substrates for placement of the µLEDs on the target substrate 628.

Through offsetting alignments of the carrier substrates, different colored µLEDs mounted on each of the carrier substrates may be directly bonded to the target substrate 628 without inadvertent bonding of adjacent, non-selected µLEDs through contact with substrate contacts of the target substrate 628. The substrate contacts on the target substrate 628 may be the pixel locations of a display, and thus the desired pixel color arrangement of µLEDs may be formed through direct bonding of µLEDs on the target substrate 628.

For example, on carrier substrate 602, µLED 604a and µLED 604b may be bonded to the target substrate 628, but not µLED 604c. µLEDs 604a, 604b and 604c (collectively 604) may have a regular spacing, such that there is a defined distance between each µLED. This defined distance can be used to determine the positions of the substrate contacts on the target substrate 628 for direct bonding of the µLEDs to the target substrate 628. The carrier substrate 602 is maneuvered over the target substrate 628 by a controller, or any other device capable of manipulating the carrier substrate 602 (not shown). µLEDs 604 are aligned with the target substrate 628 by first alignment 608. The alignment of the µLEDs on carrier substrate 602 places the µLEDs on carrier substrate 602 for direct bonding onto the target substrate 628 in line with the substrate contacts on the target substrate 628. To directly bond the µLEDs from the carrier substrate 602 to the target substrate 628, the carrier substrate 602 is brought towards to target substrate 628 until the µLED contact 606a and µLED contact 606b make contact with the substrate contacts 626c and 626e, respectively. The µLED 604a and µLED 604b are then directly bonded to the target substrate 628 through the process described with reference to FIGS. 3A through 3C. Due to the first alignment 608, only µLED 604a and µLED 604b are directly bonded to the target substrate 628, since the µLED contact 606a and the µLED contact 606b are the only contacts that are aligned with corresponding substrate contacts.

Thus, through the first alignment 608, µLED 604a and µLED 604b are bonded to the target substrate 628. However, the µLED contact 606c is not aligned with a substrate contact on the target substrate 628, and thus µLED 604c is not bonded to the target substrate 628. First offset 608 thus allows selective bonding of µLEDs from a carrier substrate 602 onto a target substrate 628, while avoiding inadvertent bonding of other µLEDs in the array of µLEDs present on the carrier substrate 602.

After the µLEDs from the carrier substrate 602 are bonded to the target substrate 628, different colored µLEDs from a second carrier substrate 610 can be directly bonded to the target substrate 628. For example, µLED 612a and µLED 612c may be directly bonded to the target substrate 628, but µLED 612b may not be directly bonded to the target substrate 628 because there is no corresponding substrate contacts on the target substrate 628. The second offset 616 of the carrier substrate 610 allows the certain µLEDs from the carrier substrate 610 to be bonded without inadvertently bonding to substrate contacts for µLEDs for other carrier substrates 612, 618.

Thus, the second offset 616 aligns the µLED contact 614a of µLED 612a with the substrate contact 626b of the target substrate 628. The second offset 616 also aligns the µLED contact 614c of µLED 612c with the substrate contact 626f. Through the alignment based on the second offset 616, the non-bonded µLED 612b and its µLED contact 614b are not aligned with a substrate contact on the target substrate 628. Thus, when the carrier substrate 610 is brought towards the target substrate 628 through the direct bonding process described in further detail with respect to FIGS. 3A through 3C, only µLEDs 612a and 612c are bonded to the target substrate 628. The second alignment 616 allows selective bonding of µLEDs from the carrier substrate 610 onto the target substrate 628, while avoiding inadvertent bonding of other µLEDs in the array of µLEDs present on the carrier substrate 610.

Furthermore, the second alignment 616 allows certain µLEDs from the carrier substrate 610 to be directly bonded to the target substrate 628 without damaging the previously bonded µLEDs from the carrier substrate 602. Unlike the example shown in FIGS. 5A and 5B, when the carrier substrate 610 is brought towards the target substrate 628 to bond µLEDs 612a and 612c, the previously bonded µLEDs (µLED 604a and µLED 604b) are not damaged, since they are displaced from any of the µLEDs on the carrier substrate 610.

Lastly, certain µLEDs on the carrier substrate 618 can be directly bonded to the target substrate 628 using the third alignment 624. For example, µLED 620a and µLED 620b may be selected to be directly bonded to the target substrate 628, but µLED 620c may not be directly bonded. The alignment based on the third offset 624 places the µLED contact 622a of µLED 620a in line with the substrate contact 626a, as well as the µLED contact 622b of µLED 620b in line with the substrate contact 626d. However, the third alignment 624 does not align µLED contact 622c of µLED 620c with any of the substrate contacts on target substrate 628. Thus, when the carrier substrate 618 is brought towards the target substrate 628 through the direct bonding process described in further detail with respect to FIGS. 3A through 3C, only µLEDs 620a and 620b are bonded to the target substrate 628. The third alignment 624 allows selective bonding of µLEDs from the carrier substrate 618 onto the target substrate 628, while avoiding inadvertent bonding of other μLEDs in the array of μLEDs present on the carrier substrate 618.

Similarly to directly bonding μLEDs from the carrier substrate 610 to the target substrate 628, the alignment of the μLEDs on carrier substrate 618 enables the μLEDs on the carrier substrate 618 to be brought towards the target substrate 628 with previously bonded μLEDs from carrier substrates 602 and carrier substrates 610 without damaging the previously bonded μLEDs or the non-selected μLEDs on the carrier substrate 618. Thus unlike the example shown in FIGS. 5A and 5B, when the carrier substrate 618 is brought towards the target substrate 628 to bond μLEDs 620a and 620c, the previously bonded μLEDs (μLED 604a, μLED 604b, μLED 612a and μLED 612c) are not damaged, since they are displaced from any of the μLEDs on the carrier substrate 618.

The μLEDs on different carrier substrates are aligned differently, allowing for selective placement of μLEDs from the three carrier substrates 602, 610 and 618 without damage to previously bonded μLEDs or inadvertent contact between non-selected μLEDs and substrate contacts on the target substrate 628 that might lead to unwanted direct bonding of μLEDs, as shown in FIGS. 5A and 5B.

The carrier substrates 602, 610 and 618 may be native substrates of their respective μLEDs, where the μLEDs are formed on the carrier substrate by masking, etching, depositing or any other technique to grow μLEDs 604a, 604b, 604c, 612a, 612b, 612c, 620a, 620b and 620c. Alternatively, the carrier substrates 602, 610, 618 may be temporary substrates which are distinct from the native substrates. In such cases, the μLEDs are transferred from the native substrates to the temporary substrates.

In one or more embodiments, the carrier substrate 602, carrier substrate 610 and carrier substrate 618 may each be formed from a flexible polymer material, such as poly (methyl methacrylate) (PMMA), poly(vinyl alcohol) (PVA) or a polyester based resin. To achieve the desired alignment, a compressive or tensile force is applied to the carrier substrate 602, carrier substrate 610 and carrier substrate 618, respectively. This force may be a compressive force that reduces the spacing between μLEDs on the carrier substrates, or the force may be a tensile force that increases the spacing between μLEDs on the carrier substrates. Thus, the separation of μLEDs and the alignment of μLEDs on the carrier substrates are varied by applying different magnitude of force.

As shown in FIG. 6A, the first offset 608, the second offset 616, and the third offset 624 are measured from a left edge of the μLEDs and a left edge of the carrier substrates 602, 610 and 618. Thus the alignments of the μLEDs is achieved by the relative spacing of the μLEDs on the carrier substrates 602, 610 and 618. Additionally or alternatively, the first offset 608, the second offset 616 and the third offset 624 may be measured from a left edge of any of the μLED contacts described herein and a left edge of the carrier substrates 602, 610 and 618. For example, while the μLED contact 606a is shown in FIGS. 6A and 6B as centered on the μLED 604a, in other embodiments, the μLED contact 606a may be offset from the center of the μLED 604a. In this example, the first offset 608 is measured from the left edge of the carrier substrate 602 to the left offset edge of the μLED contact 606a. To selectively bond the μLED 604a to the target substrate 628, the carrier substrate 602 is aligned such that the first offset 608 allows the bonding of the μLED contact 606a to the desired substrate contact. Thus the locations of the μLED contacts described herein on the μLEDs may produce the alignments described in FIG. 6A, rather than the locations of the μLEDs on the carrier substrates, as shown in FIG. 6A. This configuration of offsetting μLED contacts may be used to produce any of the alignments described herein.

The result of bonding the selected μLEDs aligned with the substrate contacts on the target substrate 628 is shown in FIG. 6B. FIG. 6B illustrates the resulting μLED configuration from the direct bonding shown in FIG. 6A. μLED 604a and μLED 604b may emit a first color light, while μLED 612a and μLED 612c emit a second color light, and μLED 620a and 620b emit a third color light, where the first, second and third colors are all different. Additionally, μLED 604a and μLED 604b originate from the carrier substrate 602, while μLED 612a and μLED 612b originate from the carrier substrate 610, and μLED 620a and μLED 620b originate from the carrier substrate 618.

Thus, the resulting μLED configuration in FIG. 6B allows for μLEDs from different carrier substrates to be selectively bonded to the target substrate 628 through direct bonding. Any arrangement of μLEDs on the target substrate 628 is possible, and the μLED configuration in FIG. 6B is shown as an example. Using the different relative alignments shown in FIG. 6A, the μLEDs can be placed onto the target substrate 628 with enough selectivity while avoiding the direct bonding challenges described with reference to FIGS. 5A and 5B.

Figure 7A:
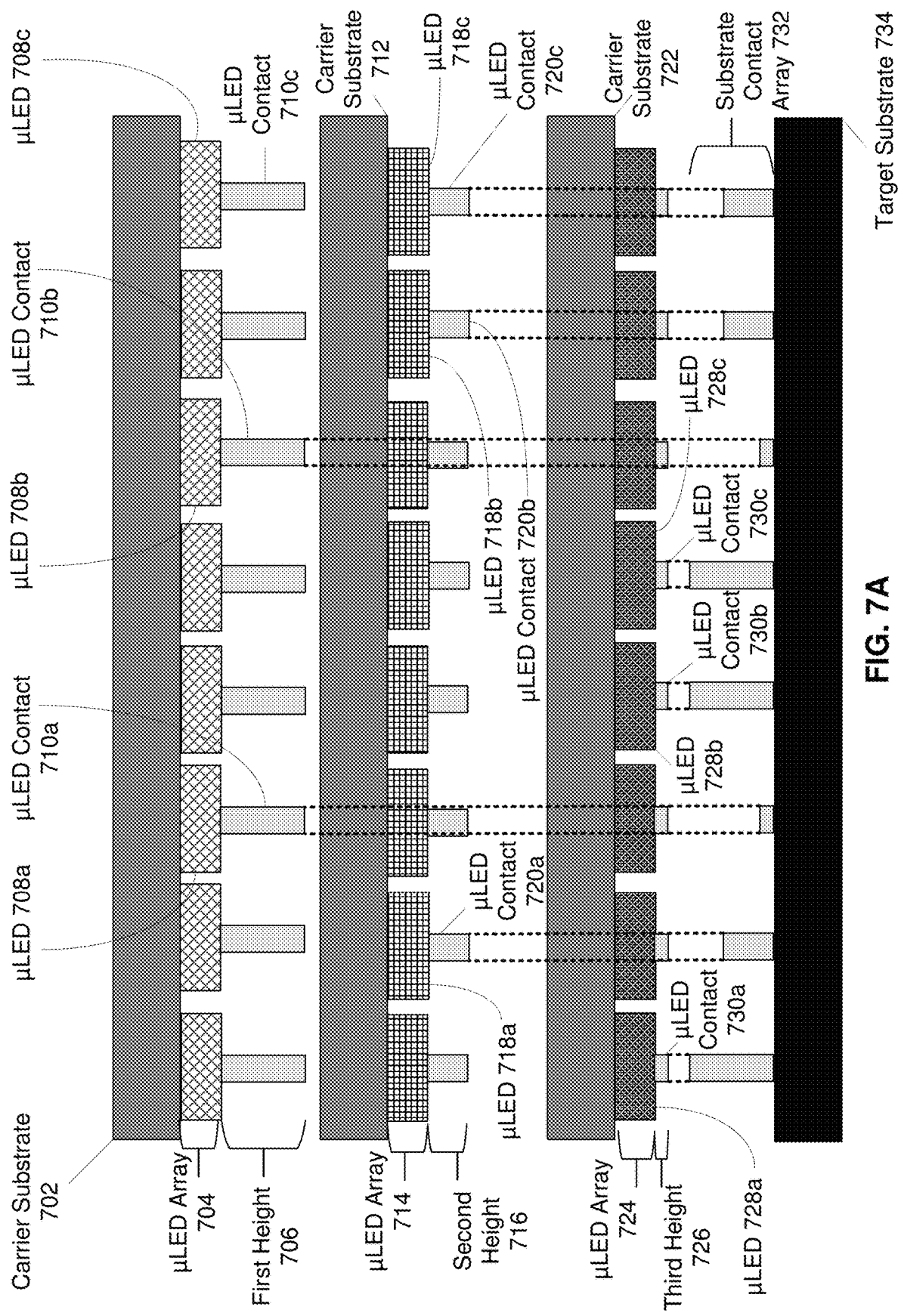
FIG. 7A illustrates direct bonding of μLEDs using different contact heights, according to one embodiment

FIG. 7A illustrates direct bonding of μLEDs using different contact heights, according to one embodiment. Direct bonding of μLEDs using different contacts heights may be an alternative or additional way to directly bond the μLEDs to the target substrate using a method described above with reference to FIGS. 6A and 6B. As shown in FIG. 7A, the carrier substrate 702 contains a μLED array 704. Within the μLED array 704, specific μLEDs are selected for bonding to the target substrate 734, while μLEDs in the array 704 are not bonded. For example, μLED 708a and μLED 708b are selected for bonding to the target substrate 734, while μLED 708c is not bonded to the target substrate 734. The μLEDs within the μLED array 704 have contacts (i.e., electrodes) of a first height 706.

A second carrier substrate, carrier substrate 712, contains μLED array 714. Similarly, within the μLED array 714, particular μLEDs are selected for bonding to the target substrate 734. As shown in FIG. 7A, μLED 718a, μLED 718b, and μLED 718c are selected for bonding to the target substrate 734, while the other μLEDs in the μLED array 714 are not bonded to the target substrate 734. The μLEDs within the μLED array 714 have contacts of a second height 716, where the second height 716 is different from the first height 706 of μLED array 704.

Figure 7B:
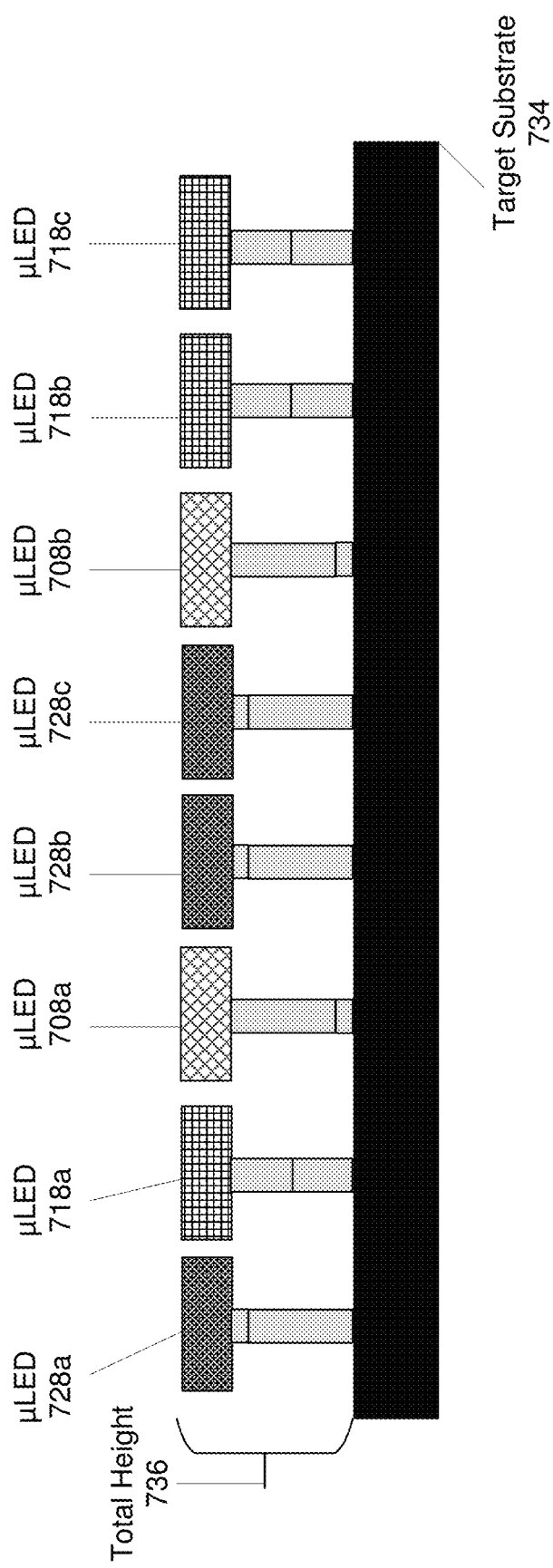
FIG. 7B illustrates the resulting μLED configuration from direct bonding shown in FIG. 7A, according to one embodiment.

A third carrier substrate, carrier substrate 722, contains a third μLED array, μLED array 724. Within the μLED array 724, particular μLEDs are selected for bonding to the target substrate 734. As shown in FIG. 7B, μLED 728a, μLED 728b and μLED 728c are selected for bonding to the target substrate 734, while the other μLEDs in the μLED array 724 are not bonded to the target substrate 734. The μLEDs within the μLED array 724 have contacts of a third height 726, which is different from the first height 706 and second height 716.

The selected μLEDs within the μLED arrays 704, 714 and 724 are bonded to the target substrate 734 through bonds resulting from physical contact between their respective μLED contacts and the substrate contact array 732 on the target substrate 734. The height of the substrate contacts in the substrate contact array 732 complement the height of the µLEDs, such that by bringing each of the µLED arrays 704, 714 and 724 and their respective µLED contacts in contact with the substrate contact array 732, the complementary heights of the substrate contacts in the substrate contact array 732 ensure that only the selected µLEDs in the µLED arrays physically come into contact with the substrate contact array 732, and are subsequently bonded to the target substrate 734.

The heights of the substrate contacts in the substrate contact array 732 may be such that their heights when added with the heights of corresponding µLED contacts results in the same total height. Thus, when a µLED with a first height 706 is bonded to a substrate contact in the substrate contact array 732, the resulting total height is the same as a µLED with a second height 716 bonded to its corresponding substrate contact in the substrate contact array 732. The complementary heights of the substrate contact array 732 ensure that only the selected µLEDs are bonded to the target substrate 734, since only µLEDs with taller µLED contacts are able to contact the corresponding shorter substrate contacts in the substrate contact array 732; and thus, are the only µLEDs bonded at these substrate contact locations, as described in further detail below. In other examples, the heights of the µLED contacts and the substrate contacts may not be complementary, and may result in µLEDs of different total heights bonded to the target substrate 734.

For example, µLEDs 728a, 728b and 728c may be the first µLEDs bonded to the target substrate 734. µLEDs 728a, 728b and 728c each have µLED contacts that are the third height 726. When the carrier substrate 722 is brought towards the target substrate 734, the µLED contact 730a, µLED contact 730b and µLED contact 730c are the only µLED contacts of the µLED array 724 that come into contact with the substrate contact array 732, because the corresponding substrate contacts that are aligned with the µLED array 724 are of complementary height. The third height 726 is the smallest height of the three sets of µLED arrays shown in FIG. 7A; and thus, is only able to contact the corresponding taller substrate contacts. For example, µLED contact 730a with third height 726 will be bonded to the aligned substrate contact, but the adjacent µLED in the µLED array 724 will not come into contact with the substrate contact array 732 because the aligned substrate contact is complementary to the second height 716, and is not tall enough to reach the third height 726 when the carrier substrate 722 is brought towards the target substrate 734.

Thus, µLED 728a, µLED 728b and µLED 728c are bonded to the target substrate 734 at the substrate contacts in the substrate contact array 732 with complementary heights through the bonding process described above with reference to FIGS. 3A through 3C. The µLEDs in the µLED array 724 that are in line with substrate contacts with heights complementary to the second height 716 or first height 706 are not bonded to the target substrate 734 since their µLED contacts do not come into contact with the substrate contact array 732.

Through the same process, µLEDs 718a, 718b and 718c are bonded to the target substrate 734. µLEDs 718a, 718b and 718c may be the second µLEDs bonded to the target substrate 734. µLEDs 718a, 718b and 718c each have µLED contacts that are the second height 716. When the carrier substrate 712 is brought towards the target substrate 734, the µLED contact 720a, µLED contact 720b and µLED contact 720c are the only µLED contacts of the µLED array 714 that come into contact with the substrate contact array 732, because the corresponding substrate contacts that are aligned with the µLED array 724 are of complementary height. The second height 716 is the second smallest height of the three sets of µLED arrays shown in FIG. 7A, and thus following the bonding of the µLEDs from µLED array 724, they are only able to contact the corresponding second tallest substrate contacts. For example, µLED contact 720a with second height 716 will be bonded to the aligned substrate contact, but the adjacent µLED in the µLED array 714 will not come into contact with the substrate contact array 732 because the substrate contact is complementary to the first height 706, and is not tall enough to reach the second height 716 when the carrier substrate 712 is brought towards the target substrate 734.

Thus µLED 718a, µLED 718b and µLED 718c are bonded to the target substrate 734 at the substrate contacts in the substrate contact array 732 with complementary heights through the bonding process described with reference to FIG. 3A through 3C. The µLEDs in the µLED array 714 that are in line with substrate contacts with heights complementary to the first height 706 are not bonded to the target substrate 734 since their µLED contacts don't come into contact with the substrate contact array 732. Substrate contacts complementary to the third height 726 are already occupied by µLEDs from the µLED array 724 from the previous bonding from carrier substrate 722.

Lastly, µLEDs 708a, 708b and 708c are bonded to the target substrate 734. µLEDs 708a, 708b and 708c may be the third µLEDs bonded to the target substrate 734. µLEDs 708a, 708b and 708c each have µLED contacts that are the first height 716. When the carrier substrate 702 is brought towards the target substrate 734, the µLED contact 710a, µLED contact 710b and µLED contact 710c are the only µLED contacts of the µLED array 704 that come into contact with the substrate contact array 732, because the corresponding substrate contacts that are aligned with the µLED array 724 are of complementary height. The first height 716 is the tallest of the three sets of µLED arrays shown in FIG. 7A, and thus following the bonding of the µLEDs from µLED arrays 724 and 714, they are only able to contact the corresponding shortest substrate contacts. For example, µLED contact 710a with first height 706 will be bonded to the aligned substrate contact, but the adjacent µLED in the µLED array 714 will not come into contact with the substrate contact array 732 because the substrate contact is already occupied by µLED 728b.

Thus, µLED 708a, µLED 708b and µLED 708c are bonded to the target substrate 734 at the substrate contacts in the substrate contact array 732 with complementary heights through the bonding process described with reference to FIG. 3A through 3C. The µLEDs in the µLED array 704 that are in line with substrate contacts with heights complementary to the second height 716 and the third height 726 are not bonded to the target substrate 734 since the substrate contacts complementary to the second height 716 and third height 726 are already occupied by µLEDs from the µLED arrays 724 and 714 from the previous bonding from carrier substrates 722 and 712.

The heights of any of the µLED contacts and/or substrate contacts described herein may be dynamically adjusted at any point during the bonding of the µLEDs from any of the carrier substrates 702, 712 and 722 to the target substrate 734. For example, a laser may be used to change the height of any of the substrate contacts in the substrate contact array 732, thus selecting or de-selecting the substrate contact for bonding with a µLED on any of the carrier substrates 702, 712 and 722 that are brought towards the target substrate 734 by altering the heights of the substrate contacts. For example, if it is determined that µLED 708b is a damaged µLED and should not be bonded to the substrate contact array 732, the height of the µLED contact 710b may be reduced such that the µLED contact 710b does not bond to the substrate contact array 732 when the carrier substrate 702 is brought towards the target substrate 734. In some examples, there may be redundant substrate contacts in the substrate contact array 732, such that if a substrate contact is tested and found to be damaged, then the height of the damaged substrate contact may be changed to de-select the substrate contact for bonding with a µLED.

FIG. 7B is a diagram illustrating the resulting µLED configuration 740 from bonding shown in FIG. 7A. µLEDs 728a, 728b and 728c are directly bonded to the substrate contacts from the first carrier substrate 722. µLEDs 718a, 718b and 718c are directly bonded to the substrate contacts from the second carrier substrate 712. µLEDs 708a and 708b are directly bonded to the substrate contacts from the third carrier substrate 702. The total height 736 is the same for each of the µLEDs bonded to the target substrate 734, since for each of the first, second and third heights (706, 716 and 726, respectively) the heights of the bonded substrate contacts are complementary. Thus, the different relative heights of the µLEDs and substrate contacts allows for selective direct bonding and placement of µLEDs from the three different carrier substrates to a single target substrate 734. Each of the carrier substrates may be either the native substrates or intermediate substrates for µLEDs of different colored emitted light. For example, µLED 728a, µLED 728b, µLED 728c may emit red light, whereas µLED 718a, 718b and 718c may emit blue light, whereas µLED 708a and µLED 708b may emit green light. Thus, direct bonding with different relative heights provides a way to selectively place colored µLEDs at desired pixel locations for a display substrate.

In other examples, the µLED 728a, 718a, 708a, 728b, 728c, 708b, 718b and 718c may each have different heights. In other examples, subsets of µLED 728a, 718a, 708a, 728b, 728c, 708b, 718b and 718c may each have different heights. For example, µLEDs of the same color may have the same height. This may allow for adjustments of the focal distance required for µLEDs of different colors, and/or any optical requirements of the system in which the target substrate 734 operates.

Figure 8A:
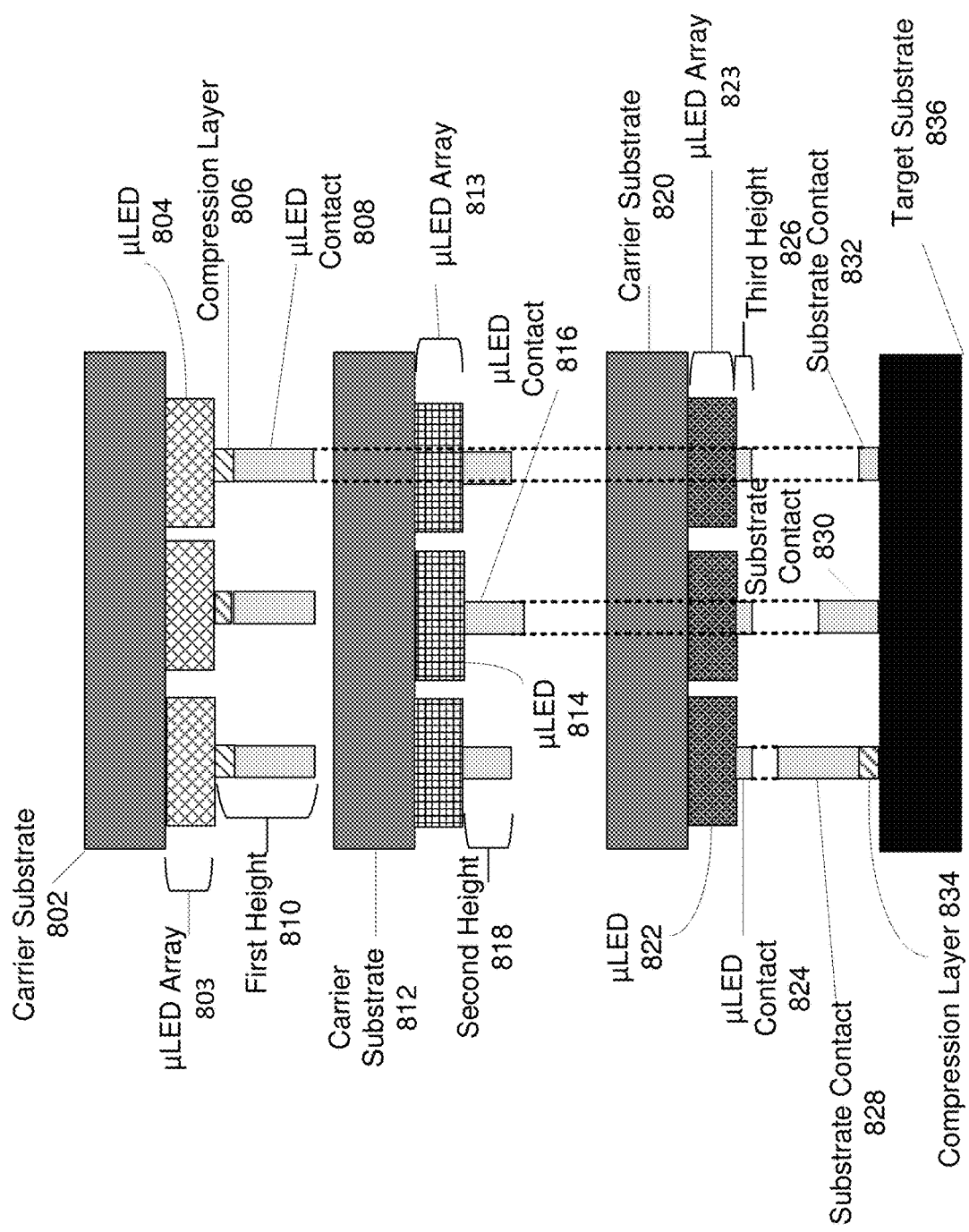
FIG. 8A illustrates a second direct bonding of μLEDs using relative heights, according to one embodiment.

A variation of direct bonding with different relative heights is described with reference to FIGS. 8A and 8B. FIG. 8A illustrates a second direct bonding of µLEDs using relative heights. Similarly to the direct bonding described in FIGS. 7A and 7B, the direct bonding in FIGS. 8A and 8B uses the relative heights of µLED contacts and substrate contacts to selectively bond µLEDs from arrays of µLEDs on different carrier substrates to the target substrate 836.

As shown in FIG. 8A, carrier substrate 802 contains µLED array 803. Of the µLEDs in the µLED array 803, µLED 804 may be selected for bonding to the target substrate 836. Each of the µLEDs in the µLED array 803 has a compression layer 806 between the base of the µLED and the µLED contact 808. The total height of the compression layer 806 and the µLED contact 808 is first height 810. The carrier substrate 812 contains µLED array 813. Of the µLEDs in the µLED array 813, µLED 814 may be selected for bonding to the target substrate 836. As shown in FIG. 8A, the µLEDs in the µLED array 813 do not contain compression layers, however in other examples they may include compression layers between the base of the µLEDs and the µLED contacts, such as µLED contact 816. The total height of the µLED contacts is the second height 818. The carrier substrate 720 contains µLED array 823. Of the µLEDs in the µLED array 823, µLED 822 may be selected for bonding to the target substrate 836. The µLEDs in the µLED array 823 have µLED contacts, such as µLED contact 824, with a third height 826. Each of the first height 810 of the µLED array 803, second height 818 of the µLED array 813, and third height 826 of the µLED array 823 may be different from each other.

On the target substrate 836, substrate contacts of complementary heights to the first height 810, second height 818, and third height 826 facilitate the selective bonding of µLEDs from the carrier substrates 802, 812 and 822 based on the relative heights of the µLEDs. The total height of the substrate contacts and their corresponding µLED contacts is the same. Thus the total height of µLED contact 808 and substrate contact 832 is the same as the total height of µLED contact 816 and substrate contact 830, and the total height of µLED contact 824 and the substrate contact 828. This ensures that following compression of the compression layers, the final columns of µLED contacts and substrate contacts are the same, and the resulting µLEDs form a uniform layer on the target substrate 836.

Each of the carrier substrates 802, 812 and 822 are brought towards the target substrate 836. The relative heights of the substrate µLED contacts and the complementary heights of the substrate contacts on the target substrate 836 ensure that only a selected µLED from the carrier substrates are directly bonded to the target substrate 836 when the carrier substrates bring the µLED contacts in physical contact with the substrate contacts.

For example, carrier substrate 820 is brought towards the target substrate 836. µLED 822 is selected from the µLED array 823 for direct bonding to the target substrate 836. The µLED contacts in the µLED array 823 have a third height 826. The substrate contact 823 is of a complementary height to the third height 826. Thus when the µLED contact 824 is directly bonded to the substrate contact 828 through the process described with respect to FIG. 3A through C, only µLED 822 in the µLED array 823 is bonded, since the adjacent substrate contacts to substrate contact 828 are complementary to the second height 818 and first height 810, and therefore the µLED contacts do not physically make contact with the substrate contacts 830 and 832 as shown in FIG. 8A. Thus µLED 822 is selectively directly bonded to the target substrate 836 while avoiding the direct bonding challenge described in FIGS. 5A and 5B.

Next, the carrier substrate 812 is brought towards the target substrate 836. µLED 814 in the µLED array 813 may be selected for direct bonding to the target substrate 836. The substrate contact 830 is a complementary height to the second height 818. Thus when the µLED contact 816 is directly bonded to the substrate contact 830, the adjacent µLEDs in the µLED array 813 are not also inadvertently bonded to the target substrate 836, since the substrate contact 832 is complementary to the first height 810 and the µLED contact 816 therefore does not make physical contact with substrate contact 832 when µLED contact 816 is bonded to substrate contact 830. The substrate contact 828 is already occupied by µLED 822, thus the other µLED in µLED array 813 is not bonded to the substrate contact 828. µLED 814 is directly bonded to the substrate contact 830 through the process described in further detail with respect to FIG. 3A through 3C.

Lastly, the carrier substrate 802 is brought towards the target substrate 836. µLED 804 in the µLED array 803 may be selected for direct bonding to the target substrate 836. The substrate contact 832 is a complementary height to the first height 810. Thus the µLED contact 808 is directly bonded to the substrate contact 832 since the μLED contact and compression layer 806 are long enough to make physical contact with the substrate contact 832, unlike the μLED contact 816 or the μLED contact 824. Non-selected μLEDs in the μLED array 803 are not bonded, since the non-complementary substrate contacts are already occupied by previous direct bonding from carrier substrate 812 and 820. μLED 804 is directly bonded to the substrate contact 832 through the process described in further detail with respect to FIG. 3A through 3C.

The compression layers shown in FIG. 8A, such as compression layer 806 and compression layer 834, may be formed from any compressible material. For example, the compression layers may be formed from a nano-foam. In other examples, the compression layers may be formed from nanoporous gold and AgSn. The compression layers absorb pressure between the μLED contacts and the substrate contacts during direct bonding. As substrate contacts are directly bonded to the μLED contacts, the combined pressure and heat may result in an uneven interface forming between bonded μLED contacts and substrate contacts. The compression layers as shown in FIG. 8A instead compress, allowing pressure applied to the interface between the substrate contacts and the μLED contacts to be distributed away from the bonding interface. Compression layers may be included between the μLED contacts and the μLED (as in the μLED array 803) and/or between the target substrate 836 and the substrate contacts (as in the compression layer 834). Additionally or alternatively, compression layers are located anywhere in the column of the substrate contacts and μLED contacts.

An example of the resulting configuration from directly bonding μLEDs from the carrier substrates 802, 812 and 820 is shown in FIG. 8B. FIG. 8B illustrates the resulting μLED configuration from direct bonding shown in FIG. 8A. As shown in FIG. 8B, the compression layers 806 and 834 are fully compressed following direct bonding of μLED 822 and μLED 804. Following compression of the compression layers 806 and 834, the total height of the μLEDs, substrate contacts and μLED contacts is the total height 838. The total height 838 is the same for each μLED directly bonded to the target substrate 836. Through the displacement of pressure away from the bonding interface between the substrate contacts and the μLED contacts, the columns of μLED contacts and substrate contacts bonding each of the μLEDs to the target substrate 836 all have the same width 842. The constant width 842 ensures a uniform resistance within the conductive column for each of the μLEDs 822, 814 and 804.

Figure 9:
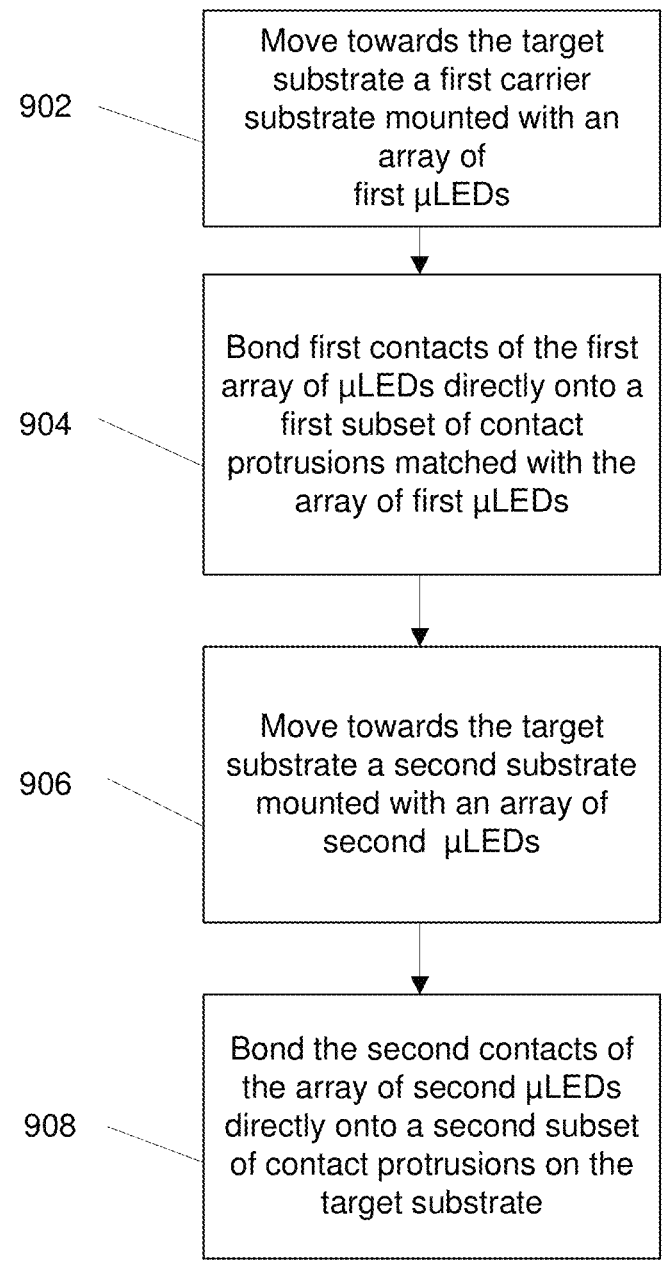
FIG. 9 is a flowchart illustrating a process for direct bonding μLEDs from multiple substrates to a single target substrate using relative alignment, according to one embodiment.

FIG. 9 is a flowchart of a process 900 for directly bonding μLEDs from multiple substrates to a single target substrate using relative alignment. At 902, a first carrier substrate mounted with an array of first μLEDs is moved towards the target substrate. This may be the step shown at FIG. 3A, and/or 6A. The target substrate may be target substrates 310 and/or 628. The first carrier substrate may be any of the carrier substrates 302, 618 and/or 610. The first μLEDs may be any of the μLEDs as shown in FIGS. 3A-3C, and/or the μLEDs 620a, 620b, 620c, 612a, 612b, and 612c.

At 904, the first contacts of the first array of μLEDs are bonded directly onto a first subset of contact protrusions aligned with the array of first μLEDs. This may be shown in FIG. 3B-3C and/or 6A. The first contacts of the first array of μLEDs may be μLED contact 622a and μLED contact 622b, or μLED contact 614a and μLED contact 614c. The first subset of contact protrusions aligned with the array of first μLEDs may be the substrate contact 626a and 626b aligned with μLED contacts 622a and 622b, respectively. Additionally or alternatively, the first subset of contact protrusions aligned with the array of first μLEDs may be the substrate contacts 626b and 626f aligned with μLED contacts 614a and 614c, respectively. At 906, a second substrate mounted with an array of second μLEDs is moved towards the target substrate. The second substrate may be carrier substrate 610 or carrier substrate 602. The second μLEDs may be the μLEDs 612a, 612b, 612c, and/or the μLEDs 604a, 604b and 604c. The target substrate may be the target substrate 628. At 908, the second contacts of the array of second μLEDs are bonded directly onto a second subset of contact protrusions on the target substrate. This may be shown in FIG. 3B-3C and/or 6A. The second contacts of the array of second μLEDs may be the μLED contacts 614a, 614b, and 614c, or μLED contact 606a and 606b. The second subset of contact protrusions may be the substrate contact 626b aligned with the μLED contact 614a, substrate contact 626f aligned with the μLED contact 614c. Additionally or alternatively, the second subset of contact protrusions aligned with the array of second μLEDs may be the substrate contacts 626c and 626e aligned with μLED contacts 606a and 606b, respectively.

Figure 10:
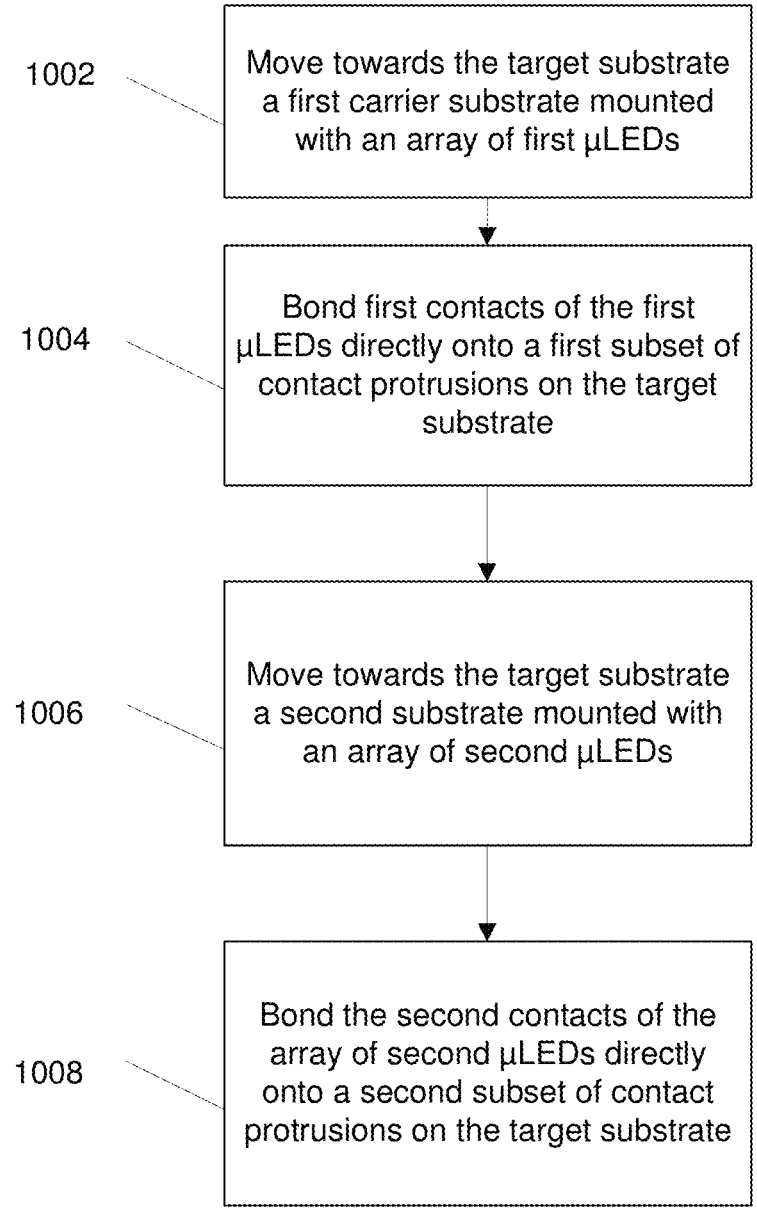
FIG. 10 is a flowchart illustrating a process for direct bonding μLEDs from multiple substrates to a single target substrate using relative height, according to one embodiment.

FIG. 10 is a flowchart of a process 1000 for directly bonding μLED from multiple substrates to a single target substrate using relative height. At 1002, a first carrier substrate mounted with an array of first μLEDs is moved towards the target substrate. This may be the step shown at FIG. 3A, and/or 7A. The target substrate may be target substrates 310 and/or 734. The first carrier substrate may be any of the carrier substrates 302, 712 and/or 722. The first μLEDs may be any of the μLEDs as shown in FIGS. 3A-3C, and/or the μLED arrays 724 or 714.

At 1004, the first contacts of the first μLEDs are bonded directly onto a first subset of contact protrusions on the target substrate. This may be shown in FIG. 3B-3C and/or 7A. The first contacts of the first array of μLEDs may be μLED contact 730a, μLED contact 730b and μLED contact 730c, or μLED contact 720a, μLED contact 720b and 720c. At 1006, a second substrate mounted with an array of second μLEDs is moved towards the target substrate. The second substrate may be carrier substrate 712 or carrier substrate 702. The second μLEDs may be the μLEDs 728a, 728b, 728c, and/or the μLEDs 718a, 718b and 718c. The target substrate may be the target substrate 734. At 1008, the second contacts of the array of second μLEDs are bonded directly onto a second subset of contact protrusions on the target substrate. This may be shown in FIG. 3B-3C and/or 7A. The second contacts of the array of second μLEDs may be the μLED contacts 720a, 720b, 720c, or μLED contacts 710a and 710b. The second subset of contact protrusions may be the substrate contacts aligned with these μLED contacts.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method of placing Light Emitting Diodes (LEDs) onto a target substrate, the method comprising:
moving, towards the target substrate, a first carrier substrate mounted with a first array of LEDs having first contacts;
bonding the first contacts of the first array of LEDs directly onto a first subset of contact protrusions on the target substrate responsive to moving the first carrier substrate, the first subset of contact protrusions being matched with the first array of LEDs;
moving, towards the target substrate, a second carrier substrate mounted with a second array of LEDs having second contacts after bonding the first contacts onto the first subset of contact protrusions;
bonding the second contacts of the second array of LEDs directly onto a second subset of contact protrusions on the target substrate responsive to moving the second substrate, the second subset of contact protrusions being matched with the second array of LEDs but mismatched with the first array of LEDs;
wherein a first height of the first contacts before bonding to the first subset of contact protrusions is different from a second height of the second contacts before bonding to the second subset of contact protrusions;
wherein a third height of the first subset of contact protrusions is different from a fourth height of the second subset of contact protrusions; and
wherein a first sum of the first height and the third height is substantially equal to a second sum of the second height and the fourth height.

2. The method of claim 1, further comprising:
moving, towards the target substrate, a third substrate mounted with a third array of LEDs having third contacts after bonding the second contacts onto the second subset of contact protrusions, wherein a fifth height of the third contacts of the third array of LEDs is different from the first height of the first contacts of the first array of LEDs and the second height of the second contacts of the second array of LEDs; and
bonding the third contacts of the third array of LEDs directly onto a third subset of contact protrusions on the target substrate responsive to moving the third target substrate.

3. The method of claim 2, wherein the first array of LEDs are configured to emit first color light, the second array of LEDs are configured to emit second color light different from the first color light, and the third array of LEDs are configured to emit third color light different from the first color light and the second color light.

4. The method of claim 1, wherein bonding first contacts of the first array of LEDs directly onto a first subset of contact protrusions on the target substrate responsive to moving the first carrier substrate further comprises:
forming an electrical contact between the first contacts of the first array of LEDs and the first subset of contact protrusions on the target substrate.

5. The method of claim 1, wherein the first subset of contact protrusions is aligned with the first array of LEDs, and the second subset of contact protrusions is aligned with the second array of LEDs but not aligned with the first array of LEDs.

6. The method of claim 5, further comprising, prior to moving a first carrier substrate mounted with a first array of LEDs towards the target substrate:
spatially separating LEDs in the first array of LEDs such that the first array of LEDs aligns the first subset of contact protrusions with the first array of LEDs.

7. The method of claim 1, wherein at least one of the first carrier substrate and the second carrier substrate is made of a polymer.

8. The method of claim 1, wherein at least one of the first carrier substrate and the second carrier substrate is a native substrate on which the first array of LEDs is fabricated.

9. The method of claim 1, wherein bonding the second contacts of the second array of LEDs directly onto the second subset of contact protrusions on the target substrate responsive to moving the first carrier substrate further comprises:
compressing a layer of nano-foam of the second subset of contact protrusions, such that the second subset of contact protrusions is matched with the second array of LEDs but mismatched with the first array of LEDs.

10. A non-transitory computer readable storage medium storing processor executable instructions, the instructions comprising instructions for:
moving, towards a target substrate, a first carrier substrate mounted with a first array of LEDs having first contacts;
bonding the first contacts of the first array of LEDs directly onto a first subset of contact protrusions on the target substrate responsive to moving the first carrier substrate, the first subset of contact protrusions being matched with the first array of LEDs;
moving, towards the target substrate, a second carrier substrate mounted with a second array of LEDs having second contacts after bonding the first contacts onto the first subset of contact protrusions; and
bonding the second contacts of the second array of LEDs directly onto a second subset of contact protrusions on the target substrate responsive to moving the second substrate, the second subset of contact protrusions being matched with the second array of LEDs but mismatched with the first array of LEDs;
wherein a first height of the first contacts before bonding to the first subset of contact protrusions is different from a second height of the second contacts before bonding to the second subset of contact protrusions;
wherein a third height of the first subset of contact protrusions is different from a fourth height of the second subset of contact protrusions; and
wherein a first sum of the first height and the third height is substantially equal to a second sum of the second height and the fourth height.

* * * * *